(12) United States Patent
Reisman (10) Patent No.: US 7,911,208 B2
(45) Date of Patent: Mar. 22, 2011

(54) METHODS FOR RECTIFICATION OF B0 INHOMOGENEITY EFFECTS IN MAGNETIC RESONANCE IMAGES

(75) Inventor: James G. Reisman, Plainsboro, NJ (US)

(73) Assignee: Siemens Aktiengesellschaft, München (DE)

( * ) Notice: Subject to any disclaimer, the term of this patent is extended or adjusted under 35 U.S.C. 154(b) by 199 days.

(21) Appl. No.: 12/250,106

(22) Filed: Oct. 13, 2008

(65) Prior Publication Data

US 2009/0096454 A1 Apr. 16, 2009

Related U.S. Application Data

(60) Provisional application No. 60/979,887, filed on Oct. 15, 2007.

(51) Int. Cl.
*G01V 3/00* (2006.01)
(52) U.S. Cl. ........................................ 324/309; 324/307
(58) Field of Classification Search .......... 324/300–322; 600/407–445; 382/130; 345/419; 128/653
See application file for complete search history.

(56) References Cited

U.S. PATENT DOCUMENTS

| | | | | | |
|---|---|---|---|---|---|
| 4,623,844 | A | * | 11/1986 | Macovski | 324/320 |
| 4,982,159 | A | * | 1/1991 | Hoshino | 324/312 |
| 5,565,777 | A | * | 10/1996 | Kanayama et al. | 324/309 |
| 6,445,182 | B1 | * | 9/2002 | Dean et al. | 324/309 |
| 6,873,153 | B2 | * | 3/2005 | Frydman | 324/307 |
| 7,289,841 | B2 | * | 10/2007 | Johnson et al. | 600/431 |
| 7,324,842 | B2 | * | 1/2008 | Dale et al. | 600/407 |
| 7,447,341 | B2 | * | 11/2008 | Karau et al. | 382/128 |
| 2008/0085041 | A1 | * | 4/2008 | Breeuwer | 382/128 |
| 2008/0219527 | A1 | * | 9/2008 | Lavi et al. | 382/128 |

* cited by examiner

*Primary Examiner* — Brij B Shrivastav
(74) *Attorney, Agent, or Firm* — Donald B. Paschburg (57) ABSTRACT

A method for reducing B0 inhomogeneous effects in magnetic resonance imaging (MRI). The method includes: obtaining a high-resolution volumetric MR image of the patient, such high-resolution volumetric MR image having B0 inhomogeneous effects; calculating distortion within obtained the high-resolution volumetric MR image of the patient; and correcting the B0 inhomogeneous effects in the obtained high-resolution volumetric image using the calculated distortion.

20 Claims, 4 Drawing Sheets

METHODS FOR RECTIFICATION OF B0 INHOMOGENEITY EFFECTS IN MAGNETIC RESONANCE IMAGES

CROSS-REFERENCE TO RELATED APPLICATIONS

This application claims priority from U.S. Provisional application No. 60/979,887 filed Oct. 15, 2007, the entire subject matter thereof being incorporated herein by reference and also to U.S. Provisional application No. 61/095,697 filed Sep. 10, 2008 the entire subject matter thereof being incorporated herein by reference.

TECHNICAL FIELD

This invention relates generally to methods for reducing B0 inhomogeneous effects in magnetic resonance imaging (MRI).

BACKGROUND AND SUMMARY

As is known in the art, the increase of the field strength of newer MR imaging machines (such as the Siemens Trio MRI) provides the opportunity for much improved image resolution and quality. A challenge with these systems is that the increased magnetic strength has resulted in magnifying B0 effects (a magnetic loading distortion effect). B0 effects present themselves as a localized distortion in the volume. B0 distortion can occur anywhere within the volume, but is most pronounced in the regions on the periphery of the iso-center of the volume. Much effort has been made to correct for these effects in the design of MRI installations [see J. Sled, G. Pike, Correction for B0 and B1 variations in quantitative measurements using MRI, Magnetic Resonance in Medicine, Vol 43, No. 4, 2000, p. 589-5931].

As is also known, whole body scans of a patient can take up 3-5 individual volume acquisitions which then must be composed together in order to capture a complete scan of an individual. Since B0 effects are most evident in the leading or trailing edges of a MR volume, having sufficient volume overlap and discarding the leading or trailing regions is a possible solution. However, these kinds of solutions will inevitably result in the need for more volumes, and the more volumes that are required for an individual, the more time individual subject workflow takes which can cut into the efficiency of a MR installation. Also, there is no certainly where B0 effects might occur in a volume. This makes narrowing the field of view of a volume an expensive and imprecise solution.

The other alternative to excising regions of a volume affected by B0 is to attempt to correct for it. Modeling the B0 effects in an image can allow for the use of image transformation filters in order to diminish or remove the distortions in a particular image. This would allow for a greater percentage of a volume acquisition to be made useable. One way is to create a volume distortion field which maps the distortion present in a particular volume. Modeling distortion requires at least measurement of the distortion in particular points or reference features in the image. If sufficient points or reference features are known, then a volume distortion field could be generated by fitting these points to a 3D fitting function. Image rectification of distortion is a well studied [see B. Zitova, J. Flusser, *Image Registration Methods: A Survey*, Image and Vision Computing, Volume 21, Number 11, October 2003, pp. 977-1000(24)].

Phantoms and feedback sensors are used to calibrate a MRI magnet and detect for distortion. B0 distortion is not solvable using calibration techniques either with or without a phantom since the mass/density distribution is idiosyncratic to a particular subject and cannot be exactly reproduced. The differences between patient and phantom at separate time instances will degrade any calibration technique that could be provided.

The method according to the present invention is to use image clues (e.g., reference identifiable characteristics) within a volume image of a patient itself, or a separate volume image of the patent taken during the same session. By only considering the identifiable characteristics within the same session, inter-temporal variation in a subject, MRI magnetic field variation, or unaccounted workflow variation can be avoided. These reference identifiable characteristics provide a "ground truth reference" image and are used to calculate distortion on a high resolution and high contrast volume image of the patient. The calculated distortion is used to correct B0 distortion in the high resolution and high contrast volume image.

Three methods are suggested for developing these reference points or reference identifiable characteristics: 1. Use of a whole body scout localization volume as the "ground truth reference" (i.e., the reference identifiable characteristics); 2. Use of a co-localized volume less sensitive to B0 effects as the "ground truth reference identifiable characteristics"; and 3. Use of tagged reference object markers as the "ground truth identifiable characteristics".

In accordance with the present invention, a method is provided for reducing B0 inhomogeneous effects in magnetic resonance imaging (MRI). The method includes: obtaining a high-resolution volumetric MR image of the patient, such high-resolution volumetric MR image having B0 inhomogeneous effects; calculating distortion within obtained the high-resolution volumetric MR image of the patient; and correcting the B0 inhomogeneous effects in the obtained high-resolution volumetric image using the calculated distortion.

In one embodiment, the distortion calculation includes obtaining a secondary reference volumetric MR image of the patient having reference identifiable characteristics; and using the reference identifiable characteristics to calculate distortion in the high-resolution volumetric MR.

In one embodiment, the calculation distortion comprises obtaining identifiable characteristics from the obtained high-resolution volumetric MR image and the correcting comprises performing image rectification on the obtained high-resolution volumetric MR image of the patient In one embodiment, the method includes: obtaining a reference volumetric MR image of a patient; extracting a first set of identifiable characteristics on the reference volumetric MR image; extracting a second set of features on the high-resolution volumetric MR image; and wherein the calculating comprises registering the reference volumetric MR image and high-resolution volumetric MR image onto a common reference coordinate system and using the extracted first set of identifiable characteristics and the second set of identifiable characteristics.

In one embodiment, the high-resolution image comprises a plurality of images, each one of the images being of a different portion of a region of the patient.

In one embodiment, the reference volumetric MR image is of the region of the patient.

In one embodiment, the reference volumetric MR image comprises a plurality of reference images, each one of the reference images being of a corresponding different portion of the region of the patient.

In one embodiment, the high resolution and the reference volumetric MR images are obtained with different protocols.

In one embodiment, the high-resolution volumetric MR image is obtained with a reference template placed on the patient, such template having MR identifiable markers, such markers providing the first set of identifiable characteristics.

In one embodiment, the method includes using a secondary image volume of the patent taken during the same session to assist in rectification of a primary image volume. This secondary volume is selected to maximize resistance to B0 effects and speed of acquisition. The primary image volume is selected for the characteristics of image resolution and image contrast that are critical to diagnosis. The secondary image volume is used to rectify to primary image volume, using a process of registering volumes to allow for generation of distortion field.

In one embodiment, the method includes: obtaining a high-resolution volumetric MR image of the patient, such high-resolution volumetric MR image having B0 inhomogeneous effects; registering the high-resolution image with a secondary image volume to obtain a resultant deformation field; and using the obtained resultant deformation field and image rectification on the obtained high-resolution volumetric MR image primary image volume to correct the B0 inhomogeneous effects in the obtained high-resolution volumetric image.

In one embodiment, the method includes: obtaining a secondary reference volumetric MR image of a patient; and registering the reference volumetric MR image and high-resolution volumetric MR image to corrected the B0 inhomogeneous effects in the obtained high-resolution volumetric image.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
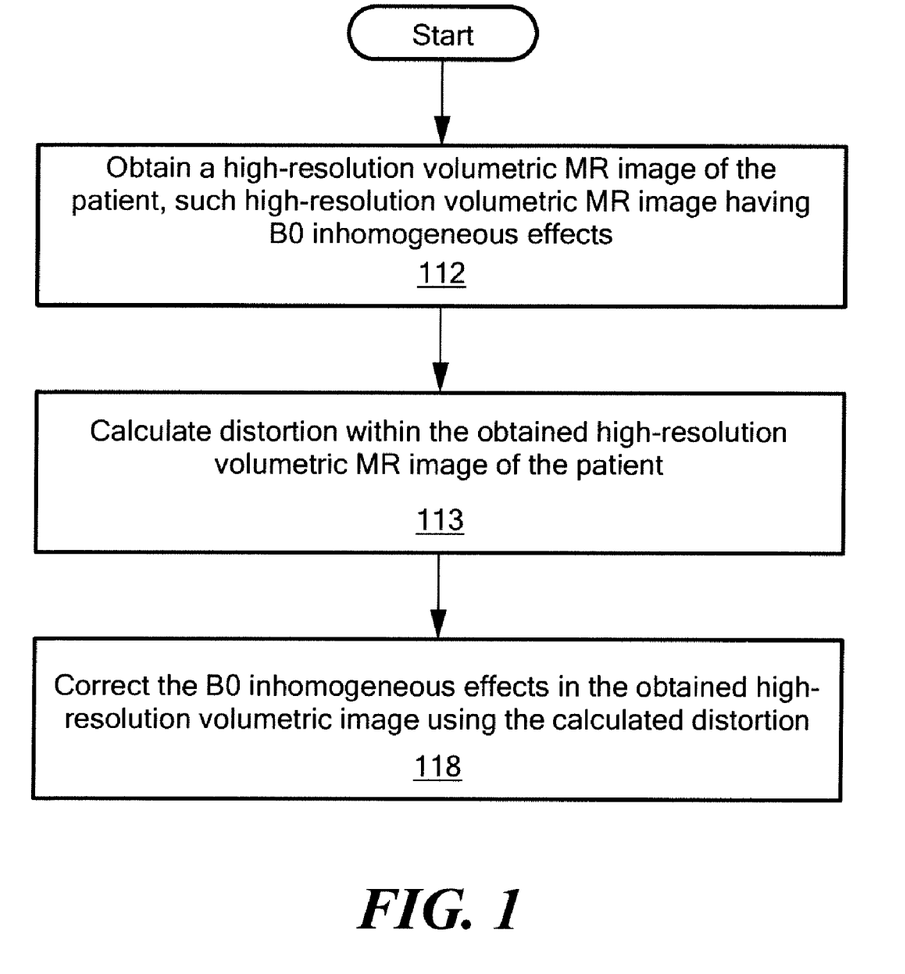
FIG. 1 is an overall flowchart of a method for reducing B0 inhomogeneous effects in magnetic resonance imaging (MRI) according to the invention.

Referring to FIG. 1, a flowchart of the method for used for reducing B0 inhomogeneous effects in magnetic resonance imaging (MRI). The method includes: obtaining a high-resolution volumetric MR image of the patient, such high-resolution volumetric MR image having B0 inhomogeneous effects (112); calculating distortion within obtained the high-resolution volumetric MR image of the patient (113); and correcting the B0 inhomogeneous effects in the obtained high-resolution volumetric image using the calculated distortion (114).

More particularly, the distortion calculation (113): obtaining a secondary reference volumetric MR image of the patient having reference identifiable characteristics; and using the reference identifiable characteristics to calculate distortion in the high-resolution volumetric MR.

More particularly, one technique that may be used to determine the distortion (described in U.S. Provisional application No. 61/095,697 filed Sep. 10, 2008 the entire subject matter thereof being incorporated herein by reference) determines a deformation field as follows: The correspondence between overlapping areas of an image pair is established via elastic registration. The algorithm estimates a deformation that maximizes the local cross-correlation between the B0 effect resistant image defined as the secondary image (i.e., an image having little B0 inhomogeneous effects) and the high-resolution image defined as the primary image (i.e., an image having significant B0 inhomogeneous effects). The deformation is represented by a smooth vector field that gives for each pixel on the primary image its corresponding location on the secondary image. Due to the nature of B0 distortion expected at the boundary of the field of view, deformations are constrained in this technique are constrained along the read-out direction. The algorithm estimates simultaneously the deformation and its inverse by composition of small displacements, incrementally maximizing the similarity criterion. This process, which can be seen as the numerical implementation of a transport equation, provides a large capture range. The smoothness of the deformation is imposed by applying a low-pass filter to the vector field increments. The process is implemented in a multi-scale approach from coarse to fine resolution which increases the speed and provides improved convergence. The "reference identifiable characteristics" in this process are the intensity values of the image volumes themselves.

Pseudo code:

Input: $I_1$ (primary image), $I_2$ (secondary image), $\sigma$ (regularization parameter)
Output: $\phi_k$ (deformation field) and $\Psi_k$ (approximated inverse deformation field),
1: $\phi_0$ = id
2: while k <max_iter do
3:   compute $v_k = \nabla S(I_1, I_2 \circ \phi_k)$ (gradient of the local cross correlation)
4:   regularize $v_k$ by convolution with a Gaussian window $w_k = G_\sigma * v_k$
5:   update $\phi_{k+1} = \phi_k \circ (id + \tau w_k)$
6:   update $\Psi_{k+1} = (id - \tau w_k) \circ \Psi_k$
7:   set k ← k + 1
8: end while $\tau$ is a small incremental step that corresponds to discretization of the the transport function being implemented. id is defined as identity mapping of the deformation field. k is the iteration number As noted in the above-referenced U.S. Provisional application No. 61/095,697, the base method used for determination of the deformation field is based on previous research see: Flows of diffeomorphisms for Multimodal Image Registration, C. Chefd'hotel, G. Hermosillo, O. Faugeras, Proceedings of the IEEE International Symposium on Biomedical Imaging, July 2002, Washington DC, USA; and A Variational Approach to Multimodal Image Matching, C. Chefd'hotel, G. Hermosillo, O. Faugeras, Proceedings of the ICCV workshop on Variational and Level Set Methods in Computer Vision, July 2001, Vancouver. B. C., Canada.

Method A: Use of Whole-Body Scout Localizer Protocols

In MRI acquisitions a relatively high-speed "scout" volume of low resolution or limited contrast is often generated of a patient, in order to better locate anatomical structures within the patient's body for a follow-up scan. Once the anatomical structure of interest in located, the follow-up scan can make volumes at a higher resolutions and contrast (which take a much longer duration). Modern MRI systems have the ability create a low-resolution whole body scan using continuous table move scans in approximately 30 seconds. A localizer using this system is constantly moving (and the volume being averaged); therefore any B0 effect would be smoothed out in the process.

Such localized images, while not of high resolution, are used herein to generate a reference image (sometimes also referred to herein as the secondary image), such reference image providing a reference for image transformation algorithms. Extracted reference features (i.e., identifiable characteristics used from the scout volume would depend upon the registration technique to be used. The technique described from the above-referenced provisional patent application No. 61/095,697 filed Sep. 10, 2008 utilitized the intensity of the the image volume voxels themselves as the extracted identifiable characteristics. Therefore by using a comparison of a high resolution image to the reference image using registration techniques, the resulting deformation field will reveal the B0 effects. Then, either correction using warping methods are implemented, or if the B0 happens to occur in a region of overlap between neighboring high resolution volume from two of the MR stations, the unaffected high resolution image used for coverage.

Figure 2:
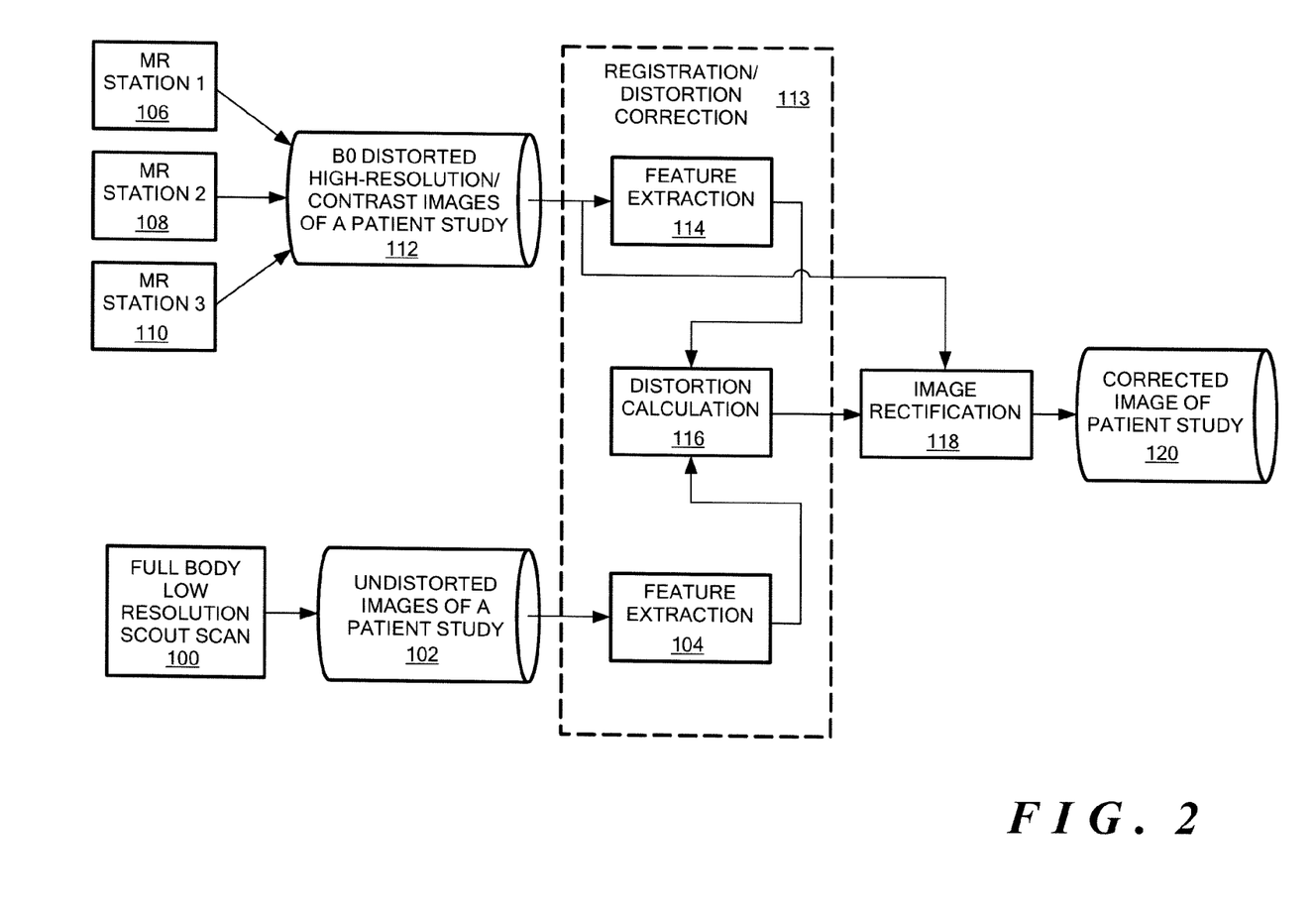
FIG. 2 is a flowchart of a method for reducing B0 inhomogeneous effects in magnetic resonance imaging (MRI) according to one embodiment of the invention.

More particularly, referring to FIG. 2, a flowchart of the process is shown. Thus, a low-resolution scout scan volumetric image is taken of a region of a patient, (100), i.e., a so-called "whole body scan". Here, the patient is slid through the bore of the MRI apparatus at a relatively high speed and image data is obtained. The obtained image data is processed by a conventional processor, not shown, to produce an undistorted (more accurately "less distorted" or "distortion-resistant") image, 102. The produced undistorted image provides a volumetric MR image of the patient. Identifiable charcteristics (features in the images such as edges) are extracted from the undistorted image (i.e., the volumetric MR image of a patient) to obtain a plurality of reference identifiable characteristics on the volumetric MR image of a patient (104).

Next, a high resolution, high contrast scanned volume image of the same region of the patient scanned is taken operating the MRI apparatus, not shown, with the region of the patient being slid through the MRI bore in steps, each step enabling sufficient time to obtain the high resolution, high contrast scanned volume image. Thus, in one step (i.e., with the portion of the region of the patient in while position or station 1 of the MRI apparatus) the upper portion of the patient is slipped into the MRI bore (106) and an MRI image of such portion is obtained (112), then, in the next step (i.e., with the patient in position or station 2 of the MRI apparatus) the middle portion of the patient is slipped into the MRI bore (108) and an MRI image of such portion is obtained (112), and the final step (i.e., with the patient in position or station 3 of the MRI apparatus) the lower portion of the patient is slipped into the MRI bore (110) and an MRI image of such portion is obtained (112). Thus, here three high resolution, high contrast scanned volume image are obtained, each one of the images being associated with a corresponding different portion of the region of the patient. Each one of the three images however will have B0 effects are most evident in the leading or trailing edges of each one of the three MRI volumes. The three high resolution, high contrast images are combined into a single "whole body" high resolution, high contrast image of the region of the patient (112).

Next, the process calculates distortion within obtained the high-resolution volumetric MR image of the patient (113). The method then uses the calculated distortion in image rectification (118) to correct the B0 inhomogeneous effects in the obtained high-resolution volumetric image (120).

More particularly, here the process of calculating distortion within obtained the high-resolution volumetric MR image of the patient (113) includes extracting identifiable characteristics (features) from the combined into a single "whole body" high resolution, high contrast image of the region of the patient (114). The identifiable characteristics (or features) are of the same identifiable characteristics or features extracted from the low resolution, low contrast image in (104). It is noted that the extracted identifiable characteristics or features in the reference image serve as reference identifiable characteristics or features. The identifiable characteristics or features extracted are defined by the requirements of the registration process. Examples of such identifiable characteristics or features is the magnitude of the image edges. Some registration algorithms do not require extracted identifiable characteristics or features per se, but have the raw intensity values of the volumes as its input. The registration method itself is not covered in the claims.

Next, the single "whole body" high resolution, high contrast image of the region of the patient (112) is registered with the single "whole body" high resolution, high contrast image of the region of the patient (112) describing the relationship of the two images. This enables calculation of the distortion in the high resolution, high contrast (116).

Having calculated the distortion, an image rectification process (118) is performed to thereby obtain a corrected high-resolution, high contrast volumetric "whole body" image of the region of the patient (120).

Thus, the whole body scout localization volume provides a "ground truth reference" which is used to remove or reduce B0 effects from the high resolution, high contrast scanned volume image.

Method B: Use of a Co-Local "Distortion-Free Scout Image"

B0 distortion is very much tied to the particular magnetic loading of the subject. Changing the protocol can change the effect of magnetic loading upon the subject and possibly decrease the effects of B0. The protocol defines how the magnetic coils of the MR scanner are excited to generate the resulting image volume and define the scanner controlling software. Choosing configurations that are less sensitive to B0 effects (even if this degrades the image quality) are used in this method to create a special "distortion-resistant image" (i.e., a reference image having a plurality of reference identifiable characteristics or features) of the same volumes size and location as the follow-up high-resolution volume.

Figure 3:
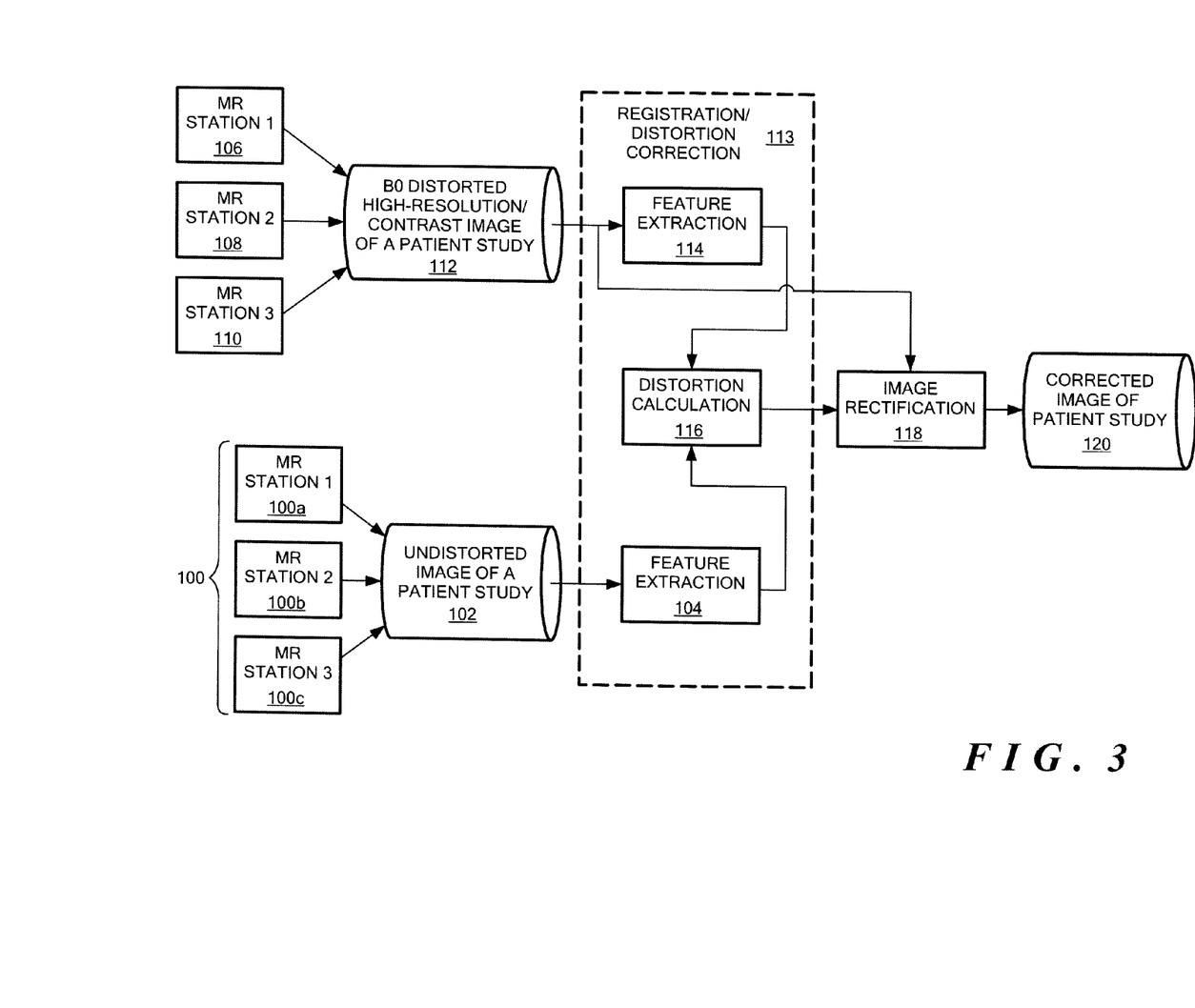
FIG. 3 is a flowchart of a method for reducing B0 inhomogeneous effects in magnetic resonance imaging (MRI) according to another embodiment of the invention.

Thus, referring to FIG. 3, a flowchart of the process is shown. Here a low-distortion reference image (100) (i.e., the secondary image) is obtained for each one of the high resolution, high contrast images (106, 108, 110); the low-distortion reference image being obtained with different protocol from the protocol used to obtain the high resolution, high contrast image is obtained for each one of the high resolution high contrast images.

Thus, in this example the three high resolution, high contrast images (106, 108, 110) are obtained using a first protocol at each one of three patient stations as in FIG. 1. Here, however, three images (100a, 100b, 100c) are obtained using a second protocol different from the first protocol at each one of three patient stations as in used when the three high resolution, high contrast images were obtained. Thus, these images 100a, 100b and 100c correspond to high resolution, high contrast images 106, 108, 110, respectively, albeit that the former images are taken using a different protocol that that used in taking latter mages. Each one of the three images provides a co-localized, distortion-free, reference (or secondary image) image volume less sensitive to B0 effects.

The obtained image data is collected in a repository, 102. It should be understood that the figure is intended to illustrate the collection of the individual volumes collected at each station. It is not a requirement that the images be first combined into a complete single image in this method. The distortion-resistant image provides a volumetric MR image of the patient. Identifiable characteristics or features are extracted from the distortion-resistant image (i.e., the volumetric MR image of a patient) to obtain a plurality of reference identifiable characteristics or features on the volumetric MR image of a patient (104).

Next, each distortion-resistant image of the region of the patient is registered with the corresponding high contrast image of the region of the patient using the reference identifiable characteristics or features and the regions extracted from the high resolution, high contrast image onto a common reference coordinate system (116) describing the relationship of the two images. This enables calculation of the distortion field (116).

Having calculated the distortion, a image rectification process (118) is performed to thereby obtain a corrected high-resolution, high contrast volumetric image of the region of the patient (120).

Thus, the individual distortion-resistant provides a "ground truth references" which is used to remove or reduce B0 effects from the high resolution, high contrast scanned volume image.

Method C: Use of Tagged Reference Object Markers

An alternate method for modeling local distortion within an image is to have objects of know size or location located within the field of view to thereby provide a reference image having a plurality of reference. These references objects (i.e., reference identifiable characteristics or features are, for example, added to the MRI by a reference template place on the patient, such template having reference detectable identifiable characteristics or features (e.g., objects that possess predetermined (and distinctive) magnetic resonance properties. If these reference objects are measured to have a different size or location than expected, then this information is used to model the distortion field of the B0 effects. Such objects would be detected and separate from the MRI image, prior to use by the end-user.

One implementation of such a template would be a blanket, which contained imbedded square plates whose magnetic resonance properties are known, placed on he patient. This blanket is typically very light, but the plates inside would be rigid. These plates (i.e., reference identifiable characteristics or features) have known dimensions (approximately 5 cm×5 cm). When placed on top of the patient and imaged, these plates provide reference as to the exact degree of distortion occurring in the location of the plate. Since the plates are of very regular size, when the output image is produced, these would be very easily detectable and subtracted from the image.

Figure 4:
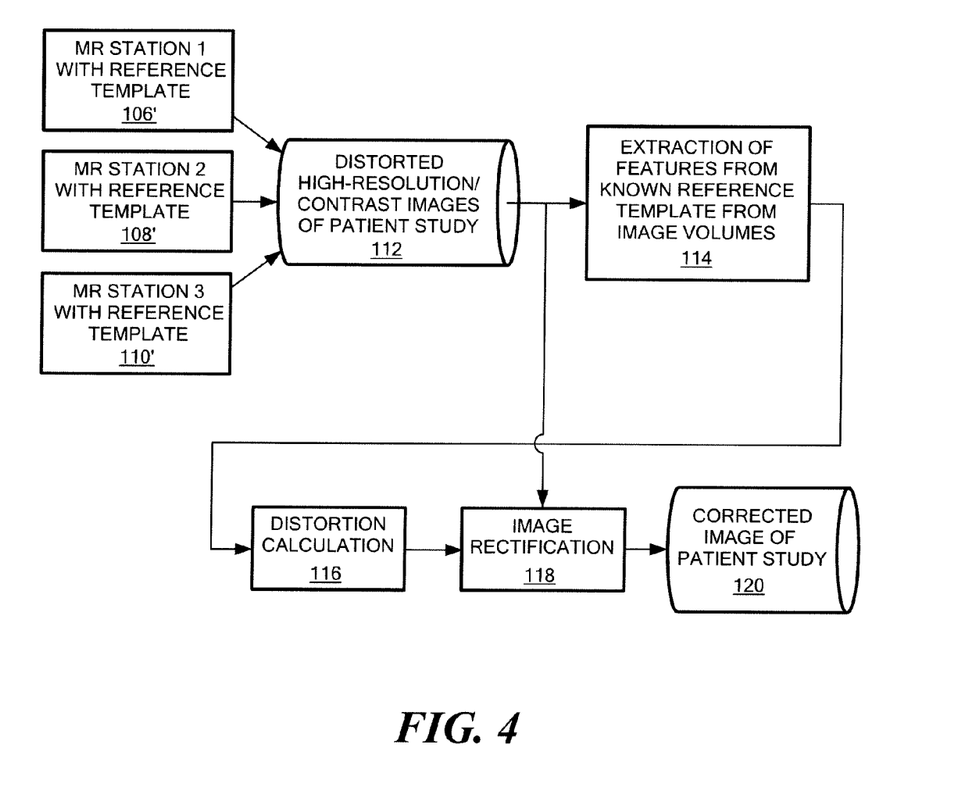
FIG. 4 is a flowchart of a method for reducing B0 inhomogeneous effects in magnetic resonance imaging (MRI) according to still another embodiment of the invention.

Thus, referring to FIG. 4, a high resolution, high contrast scanned volume image of the region of the patient having the reference template is taken operating the MRI apparatus, not shown, with the region of the patient being slid through the MRI bore in steps, each step enabling sufficient time to obtain the high resolution, high contrast scanned volume image. Thus, in one step (i.e., with the portion of the region of the patient in while position or station 1 of the MRI apparatus) the upper portion of the patient is slipped into the MRI bore (106') and an MRI image of such portion is obtained (112), then, in the next step (i.e., with the patient in position or station 2 of the MRI apparatus) the middle portion of the patient is slipped into the MRI bore (108') and an MRI image of such portion is obtained (112), and the final step (i.e., with the patient in position or station 3 of the MRI apparatus) the lower portion of the patient is slipped into the MRI bore (110') and an MRI image of such portion is obtained (112). Thus, here three high resolution, high contrast scanned volume image are obtained, each one of the images being associated with a corresponding different portion of the region of the patient. Each one of the three images however will have B0 effects are most evident in the leading or trailing edges of each one of the three MRI volumes. The three high resolution, high contrast images are collected into a repository (112). As mentioned in the previous method, composing the individual volumes into a complete volume first is not a necessary step. It is possible to rectify the images without this (although in this method it may be useful).

Next, identifiable characteristics or feature extraction, here extraction of the identifiable characteristics or reference features of the template, is performed. (114). It is noted that there is no low-contrast images in this method.

Next, identifiable characteristics or reference features are used to correct distortion in the high resolution, high contrast image of the region of the patient.

A number of embodiments of the invention have been described. Nevertheless, it will be understood that various modifications may be made without departing from the spirit and scope of the invention. For example, three MR stations are described, the number of stations may be other than three. Accordingly, other embodiments are within the scope of the following claims.

What is claimed is:

1. A method, comprising:
   obtaining a low-resolution reference volumetric MR image of an anatomical structure of interest, such low-resolution reference volumetric MR image being distortion-resistant;
   obtaining a high-resolution volumetric MR image of the anatomical structure of interest, such high-resolution volumetric MR image having B0 inhomogeneous effects;
   registering the low-resolution reference volumetric MR image with the high-resolution volumetric MR image;
   calculating a distortion within the high-resolution volumetric MR image of the anatomical structure of interest based on a registration of the low-resolution reference volumetric MR image with the high-resolution volumetric MR image; and
   correcting the B0 inhomogeneous effects in the high-resolution volumetric MR image using the distortion.

2. The method recited in claim 1 further comprising:
   extracting reference identifiable characteristics from the low-resolution reference volumetric MR image; and extracting high-resolution identifiable characteristics from the high-resolution volumetric MR image, wherein the high-resolution identifiable characteristics correspond to the reference identifiable characteristics;

registering the low-resolution reference volumetric MR image with the high-resolution volumetric MR image is based on a comparison of the reference identifiable characteristics and the high-resolution identifiable characteristics.

3. The method recited in claim 2 wherein the reference identifiable characteristics and the high-resolution identifiable characteristics comprise edges in the low-resolution reference volumetric MR image and the high-resolution volumetric MR image.

4. The method recited in claim 1 further comprising:
performing image rectification on the high-resolution volumetric MR image of the anatomical structure of interest.

5. The method recited in claim 1 wherein:
the low-resolution reference volumetric MR image and the high-resolution volumetric MR image are registered onto a common reference coordinate system.

6. The method recited in claim 1 wherein the high-resolution volumetric MR image comprises a plurality of high-resolution images, and each one of the plurality of high-resolution images corresponds to a different portion of a region of the anatomical structure of interest.

7. The method recited in claim 6 wherein the low-resolution reference volumetric MR image corresponds to the entire region of the anatomical structure of interest.

8. The method recited in claim 6 wherein the low-resolution reference volumetric MR image comprises a plurality of reference images, and each one of the plurality of reference images corresponds to a different one of the plurality of high-resolution images.

9. The method recited in claim 8 wherein the plurality of high-resolution images and the plurality of reference images are obtained using different protocols.

10. The method recited in claim 1 wherein the high-resolution volumetric MR image is obtained with a reference template placed on the anatomical structure of interest, the reference template comprises MR identifiable markers, and the MR identifiable markers provide a set of identifiable characteristics.

11. A method for reducing B0 inhomogeneous effects in magnetic resonance imaging (MRI), comprising:
obtaining a primary image volume of an anatomical structure of interest, wherein the primary image volume has a high image resolution and includes B0 inhomogeneous effects;
obtaining a secondary image volume of the anatomical structure of interest, wherein the secondary image volume has an image resolution lower than the high image resolution of the primary image volume and does not include B0 inhomogeneous effects, and an acquisition time of the secondary image volume is less than an acquisition time of the primary image volume;
calculating distortion within the primary image volume based on a comparison of the primary image volume and the secondary image volume; and
reducing the B0 inhomogeneous effects in the primary image volume using the calculated distortion.

12. The method recited in claim 11 further comprising:
extracting primary identifiable characteristics from the primary image volume; and
extracting secondary identifiable characteristics from the secondary image volume, wherein the secondary identifiable characteristics correspond to the primary identifiable characteristics, wherein
calculating the distortion within the primary image volume is based on a comparison of the primary identifiable characteristics and the secondary identifiable characteristics.

13. The method recited in claim 12 wherein the primary identifiable characteristics and the secondary identifiable characteristics comprise edges in the primary image volume and the secondary image volume.

14. The method recited in claim 11 wherein the primary image volume comprises a plurality of high-resolution images, and each one of the plurality of high-resolution images corresponds to a different portion of a region of the anatomical structure of interest.

15. The method recited in claim 14 wherein the secondary image volume comprises a plurality of low-resolution images, and each one of the plurality of low-resolution images corresponds to a different one of the plurality of high-resolution images.

16. A method for reducing B0 inhomogeneous effects in magnetic resonance imaging (MRI), comprising:
obtaining a high-resolution volumetric MR image of an anatomical structure of interest, such high-resolution volumetric MR image having B0 inhomogeneous effects;
registering the high-resolution volumetric MR image with a secondary volumetric MR image of the anatomical structure of interest;
obtaining a deformation field based on a registration of the high-resolution volumetric MR image with the secondary volumetric MR image, wherein the deformation field reveals the B0 inhomogeneous effects; and
correcting the B0 inhomogeneous effects in the high-resolution volumetric MR image based on the deformation field.

17. The method recited in claim 16 further comprising:
extracting high-resolution identifiable characteristics from the high-resolution volumetric MR image; and
extracting low-resolution identifiable characteristics from the secondary volumetric MR image, wherein the low-resolution identifiable characteristics correspond to the high-resolution identifiable characteristics, wherein
registering the high-resolution volumetric MR image with the secondary volumetric MR image is based on a comparison of the high-resolution identifiable characteristics and the low-resolution identifiable characteristics.

18. The method recited in claim 16 wherein the high-resolution volumetric MR image comprises a plurality of high-resolution images, and each one of the plurality of high-resolution images corresponds to a different portion of a region of the anatomical structure of interest.

19. The method recited in claim 18 wherein the secondary volumetric MR image comprises a plurality of low-resolution images, and each one of the plurality of 7low-resolution images corresponds to a different one of the plurality of high-resolution images.

20. A method for reducing B0 inhomogeneous effects in magnetic resonance imaging (MRI), comprising:
obtaining a low-resolution reference volumetric MR image of an anatomical structure of interest, wherein the low-resolution reference volumetric MR image is distortion-resistant, comprises a plurality of reference images, and each one of the plurality of reference images corresponds to a different portion of a region of the anatomical structure of interest;

extracting reference identifiable characteristics from the plurality of reference images;

obtaining a high-resolution volumetric MR image of the anatomical structure of interest, wherein the high-resolution volumetric MR image has B0 inhomogeneous effects, comprises a plurality of high-resolution images, and each one of the plurality of high-resolution images corresponds to a different one of the plurality of reference images;

extracting high-resolution identifiable characteristics from the plurality of high-resolution images;

registering each of the plurality of reference images with a corresponding one of the plurality of high-resolution images based on the extracted reference identifiable characteristics and the extracted high-resolution identifiable characteristics;

calculating distortion within the high-resolution volumetric MR image based on the registration; and correcting the B0 inhomogeneous effects in the high-resolution volumetric MR image.

\* \* \* \* \*